United States Patent
Hariharasudhan et al.

(10) Patent No.: US 9,625,529 B2
(45) Date of Patent: Apr. 18, 2017

(54) BATTERY PACK MANAGEMENT

(75) Inventors: K. R. Hariharasudhan, Noida (IN); Frank J. Sigmund, Coppell, TX (US)

(73) Assignees: STMicroelectronics, Inc., Coppell, TX (US); STMicroelectronics International N.V., Schiphol (NL)

(*) Notice: Subject to any disclaimer, the term of this patent is extended or adjusted under 35 U.S.C. 154(b) by 1105 days.

(21) Appl. No.: 13/294,299

(22) Filed: Nov. 11, 2011

(65) Prior Publication Data

US 2013/0124121 A1    May 16, 2013

(51) Int. Cl.
*G01R 31/36* (2006.01)

(52) U.S. Cl.
CPC ...... *G01R 31/3624* (2013.01); *G01R 31/3651* (2013.01)

(58) Field of Classification Search
CPC ............ G01R 31/3624; G01R 31/3648; G01R 31/3662
USPC ........................................................ 702/63
See application file for complete search history.

(56) References Cited

U.S. PATENT DOCUMENTS

| | | | | |
|---|---|---|---|---|
| 3,886,442 A | * | 5/1975 | Chiku et al. | 324/427 |
| 4,377,787 A | * | 3/1983 | Kikuoka | G01R 31/3613 324/426 |
| 4,952,862 A | * | 8/1990 | Biagetti et al. | 320/132 |
| 5,936,383 A | * | 8/1999 | Ng | G01R 31/361 320/132 |
| 6,107,779 A | * | 8/2000 | Hara | G01R 31/3613 320/132 |
| 2002/0021108 A1 | * | 2/2002 | Suzuki | G01R 31/3655 320/132 |
| 2005/0024905 A1 | * | 2/2005 | Shiojima | H02J 9/061 363/110 |
| 2011/0234167 A1 | * | 9/2011 | Kao et al. | 320/132 |
| 2012/0131367 A1 | * | 5/2012 | Kamijima | 713/323 |

* cited by examiner

*Primary Examiner* — Michael Nghiem
(74) *Attorney, Agent, or Firm* — Gardere Wynne Sewell LLP

(57) ABSTRACT

A battery pack management system provides information such as remaining capacity and/or run time to empty for a battery. A time taken for a battery voltage to drop a threshold amount is measured and used to determine a remaining capacity of the battery. The time may be associated with a temperature and current of the battery. The remaining capacity of a battery is calculated by monitoring a discharge of the battery. For example, current drawn from the battery is monitored over a period of time and an initial amount by which the battery has been discharged is calculated. Compensation of this initial amount is carried out in order to take into account factors such as temperature, self-discharge rate and age of the battery.

30 Claims, 4 Drawing Sheets

BATTERY PACK MANAGEMENT

TECHNICAL FIELD

Embodiments relate to battery pack management systems and particularly, but not exclusively, to determining characteristics of a battery for example a run time to empty and/or remaining capacity of a battery.

BACKGROUND

Battery pack management systems exist in order to monitor battery usage of a device. Battery pack management systems may provide, for example, information regarding a remaining capacity of a battery and/or a remaining time for which the battery can provide power without recharge. Such systems may allow for example a device to save data before power is lost.

A simplistic way of monitoring the remaining capacity of the battery is monitoring the current drawn from the battery over a period of time. However this may be inaccurate because factors such as a self-discharge rate and coulombic efficiency may affect the level of charge in the battery.

Some systems may monitor the chemical make-up and weight of the battery in order to more accurately estimate a remaining capacity of the battery. For these systems to work, detailed information of the battery needs to be available regarding the chemical make-up of the battery and special hardware needs to be incorporated with the battery.

SUMMARY

According to a first aspect, a method comprises: determining a plurality of times corresponding to a change in voltage of a battery, each time associated with a condition of the battery; and calculating a remaining time to empty of the battery based on at least one of the determined plurality of times.

The condition may be at least one of battery temperature and battery current. Each time may be further associated with a voltage step of the battery. The battery voltage may comprise a plurality of voltage steps from a maximum voltage to a cut-off voltage. The change in voltage may correspond to a step size of the voltage step.

Determining a remaining time to empty of the battery may comprise summing the times associated with each of the plurality of voltage steps from a battery voltage to the cut-off voltage. The step of determining the plurality of times may comprise measuring a time taken for the change in voltage. The determining the plurality of times may comprise retrieving at least one of the plurality of times from a memory.

The step of determining the plurality of times may comprise: measuring a time associated with a first battery condition and a first voltage step; retrieving a stored time associated with the first battery condition and the first voltage step; comparing the stored time and the measured time; and if the times are different replacing the stored time with the measured time.

The method may further comprise storing each of the plurality of times in a table. The method may further comprise: determining if the first battery condition has been constant during the first voltage step; and if the first battery condition has been constant: measuring the time. Measuring the time may comprise receiving a timer value. The method may further comprise: compensating a remaining capacity of the battery based on the run time to empty.

The step of compensating may comprise: adjusting an amount by which the battery has discharged since a previous calculation of remaining capacity; calculating the remaining capacity based on the adjusted amount. The amount by which the battery has discharged may be calculated as the amount of current drawn by the battery over a period of time. The period of time may be one second.

The method may further comprise: determining a variation of the at least one battery condition since the previous calculation of remaining capacity; and if there is a variation: compensating the amount by which the battery has discharged.

According to a second aspect, a method comprises: determining an amount by which a battery at a first battery condition has discharged since a previous calculation of remaining capacity of the battery; determining a variation of the first battery condition since the previous calculation of remaining capacity; and if there is a variation: retrieving a plurality of times associated with the first battery condition from a memory, each of the plurality of times associated with a respective one of a plurality voltage steps from the battery voltage to a cut-off voltage; and compensating a remaining capacity of the battery based on the retrieved time.

The step of compensating may comprise calculating a run time to empty of the battery and compensating the remaining capacity based on the run time to empty.

According to a third aspect, there is provided an apparatus comprising: a processor configured to determine a plurality of times corresponding to a change in voltage of a battery, each time associated with a condition of the battery; and calculate a remaining time to empty of the battery based on at least one of the determined plurality of times.

The condition may be at least one of battery temperature and battery current. Each time may be further associated with a voltage step of the battery. The battery voltage may comprise a plurality of voltage steps from a maximum voltage to a cut-off voltage. The change in voltage may correspond to a step size of the voltage step.

The processor may be further configured to determine the remaining time to empty of the battery by summing the times associated with each of the plurality of voltage steps from a battery voltage to the cut-off voltage. The processor may be configured to determine the plurality of times by measuring a time taken for the change in voltage. The processor may be further configured to determine the plurality of times by retrieving at least one of the plurality of times from a memory.

The processor may be configured to determine the plurality of times by measuring a time associated with a first battery condition and a first voltage step; retrieving a stored time associated with the first battery condition and the first voltage step; comparing the stored time and the measured time; and if the times are different replacing the stored time with the measured time. The processor may be further configured to store each of the plurality of times in a table.

The processor may be further configured to: determine if the first battery condition has been constant during the first voltage step; and if the first battery condition has been constant: measure the time. The processor may be further configured to receive a timer value and measure the time based on the received timer value. The processor may be further configured to compensate a remaining capacity of the battery based on the run time to empty.

The processor may be configured to compensate the remaining capacity by adjusting an amount by which the battery has discharged since a previous calculation of remaining capacity and calculating the remaining capacity based on the adjusted amount. The amount by which the battery has discharged may be calculated as the amount of current drawn by the battery of a period of time. The period of time may be one second.

The processor may be further configured to determine a variation of the at least one battery condition since the previous calculation of remaining capacity; and if there is a variation: compensate the amount by which the battery has discharged. The apparatus may further comprise: a memory configured to store at least one of the plurality of times. The apparatus may further comprise a timer configured to measure an amount of time taken for the change in voltage of the battery.

According to a fourth aspect, an apparatus comprises: a battery manager, the battery manager comprising: a memory; and a processor configured to determine an amount by which a battery at a first battery condition has discharged since a previous calculation of remaining capacity of the battery; determine a variation of the first battery condition since the previous calculation of remaining capacity; and if there is a variation: retrieve a plurality of times associated with the first battery condition from the memory, each of the plurality of times associated with a respective one of a plurality voltage steps from the battery voltage to a cut-off voltage; and compensate a remaining capacity of the battery based on the retrieved times.

The remaining capacity may be compensated by calculating a run time to empty of the battery and compensating the remaining capacity based on the run time to empty.

According to a fifth aspect, an apparatus comprises: processor means for determining a plurality of times corresponding to a change in voltage of a battery, each time associated with a condition of the battery, and calculating a remaining time to empty of the battery based on at least one of the determined plurality of times.

According to a sixth aspect, an apparatus comprises: a battery manager, the battery manager comprising: memory means; and processor means for determining an amount by which a battery at a first battery condition has discharged since a previous calculation of remaining capacity of the battery, determining a variation of the first battery condition since the previous calculation of remaining capacity, and if there is a variation: retrieving a plurality of times associated with the first battery condition from the memory means, each of the plurality of times associated with a respective one of a plurality voltage steps from the battery voltage to a cut off voltage, and compensating a remaining capacity of the battery based on the retrieved times.

According to a seventh aspect, a computer program product comprises a computer readable instructions for carrying out the steps of: determining a plurality of times corresponding to a change in voltage of a battery, each time associated with a condition of the battery; and calculating a remaining time to empty of the battery based on at least one of the determined plurality of times.

The condition may be at least one of battery temperature and battery current. Each time may be further associated with a voltage step of the battery. The battery voltage may comprise a plurality of voltages steps from a maximum voltage to a cut-off voltage. The change in voltage may correspond to a step size of the voltage step.

Determining a remaining time to empty of the battery may comprise summing the times associated with each of the plurality of voltage steps from a battery voltage to the cut-off voltage. The step of determining the plurality of times may comprise measuring a time taken for the change in voltage.

The determining the plurality of times may comprise retrieving at least one of the plurality of times from a memory.

The step of determining the plurality of times may comprise: measuring a time associated with a first battery condition and a first voltage step; retrieving a stored time associated with the first battery condition and the first voltage step; comparing the stored time and the measured time; and if the times are different replacing the stored time with the measured time.

The computer program product may comprise further computer readable instructions for carrying out the step of storing each of the plurality of times in a table. The computer program may further comprise further computer readable instructions for carrying out the steps of: determining if the first battery condition has been constant during the first voltage step; and if the first battery condition has been constant: measuring the time. Measuring the time may comprise receiving a timer value.

The computer program product may further comprise further computer readable instructions for carrying out the step of: compensating a remaining capacity of the battery based on the run time to empty. The step of compensating may comprise: adjusting an amount by which the battery has discharged since a previous calculation of remaining capacity; calculating the remaining capacity based on the adjusted amount.

The amount by which the battery has discharged may be calculated as the amount of current drawn by the battery of a period of time. The period of time may be one second.

The computer program product may further comprise further computer readable instructions for carrying out the step of: determining a variation of the at least one battery condition since the previous calculation of remaining capacity; and if there is a variation: compensating the amount by which the battery has discharged.

According to an eighth aspect, a computer program product comprises a computer readable instructions for carrying out the steps of: determining an amount by which a battery at a first battery condition has discharged since a previous calculation of remaining capacity of the battery; determining a variation of the first battery condition since the previous calculation of remaining capacity; and if there is a variation: retrieving a plurality of times associated with the first battery condition from a memory, each of the plurality of times associated with a respective one of a plurality voltage steps from the battery voltage to a cut-off voltage; and compensating a remaining capacity of the battery based on the retrieved time.

The step of compensating may comprise calculating a run time to empty of the battery and compensating the remaining capacity based on the run time to empty.

DETAILED DESCRIPTION OF THE DRAWINGS

Embodiments provide a battery pack management system that provides information such as remaining capacity and/or run time to empty for a battery. In embodiments a time taken for a battery voltage to drop a threshold amount may be measured and used to determine a remaining capacity of the battery. The time may be associated with a temperature and current of the battery.

In some embodiments the remaining capacity of a battery may be calculated by monitoring a discharge of the battery. For example, current drawn from the battery may be monitored over a period of time and an initial amount by which the battery has been discharged may be calculated based on this. Compensation of this initial amount may be carried out in order to take into account factors such as temperature, self-discharge rate and age of the battery.

The compensation may be carried out in response to a table. The table may store information relating to factors that may affect the battery performance. For example, the table may contain information regarding a time taken for the battery to drop a voltage level while discharging. The time may be associated with a temperature and discharge current. In embodiments the table may be updated throughout the battery operation. For example the table may be updated corresponding to a number of charge/discharge cycles of the battery. This may provide an indication of the change in battery performance with age.

Figure 1:
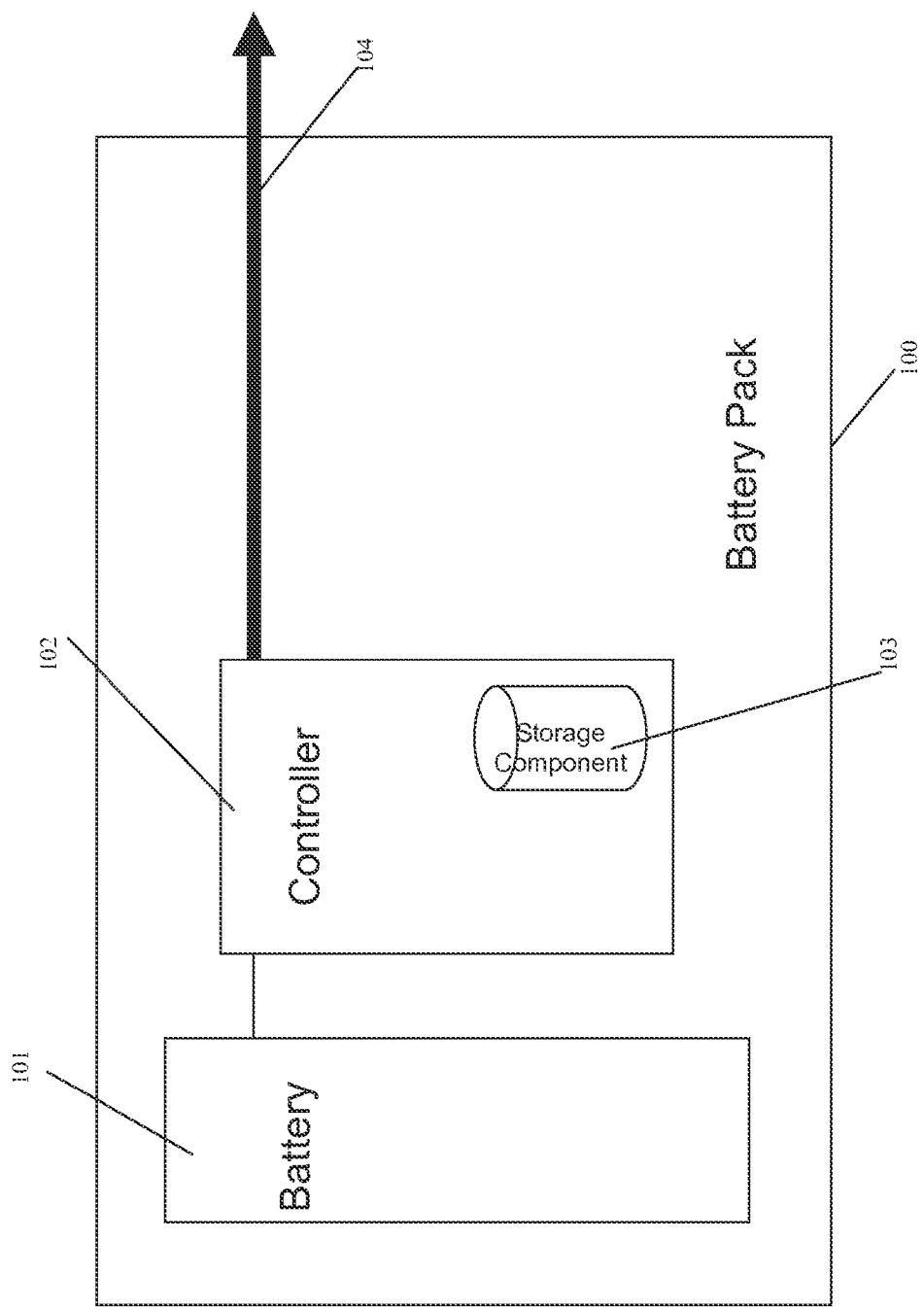
FIG. 1 shows an example of a battery pack.

FIG. 1 shows an example of a battery pack 100. The battery pack 100 comprises a battery 101. The battery 101 may be a single or a multi-cell battery. In some embodiments the battery 101 is a lithium ion (Li-ion) battery. However it will be appreciated that any suitable battery may be used. In some embodiments the battery pack 100 is for use with a portable device. For example the battery pack 100 may be suitable for use in powering portable devices such as PDAs, laptops, mobile phones, pagers, netbooks, tablets, satellite navigation handsets and other similar devices. Alternatively the battery pack may be used as a back-up power source to stationery devices or devices without access to mains power.

The battery pack 100 may further comprise a controller 102. The controller 102 may be an integrated circuit such as a microcontroller, application specific integrated circuit, or combination thereof. The controller 102 may have access to a storage component 103. The storage component may be part of the controller 102 or may be a separate component. The storage component may be any appropriate memory, for example EEPROM or RAM.

The controller 102 may be connected to the battery 101. The controller 102 may be connected to the battery 101 via in-built or external sensors and may be capable of measuring characteristics of the battery such as a voltage, current, temperature and/or other characteristics. The controller 102 may also be connected to a processor of a device for which the battery provides power. This controller 102 may be connected to the processor via a connection 104.

It will be appreciated that the battery pack may optionally comprise packaging for the protection of the battery pack and the insertion of the battery pack into a portable device. For example the battery pack 100 may further comprise a housing with connectors for the physical connection and retention of the battery pack 100 within a device. It will also be appreciated that additional circuitry may be implemented in the battery pack 100.

The connection 104 may provide a communication medium between the battery pack controller 102 and a processor of a device using power provided by the battery pack 100.

In some embodiments connection 104 is a system bus. In some embodiments the system bus 104 may be compliant with the smart battery system and may be a smart battery system standard compliant bus.

The smart battery system standard is a standard for the implementation of battery management and comprises a number of standard commands for communication between a host processor and a battery pack. For example, the smart battery system standard provides commands for the display of a remaining battery capacity.

The smart battery data specification may have a number of commands which may be implemented over the bus 104. Typically communication between the controller 102 and a processor may include a number of commands. For example commands relating to the request for information such as temperature, voltage, average current, remaining capacity of the battery, full charge capacity and run time to empty may be requested over the bus 104. It will be appreciated that other commands may be requested over this bus and these commands are by way of example only. These commands may be in line with the smart battery system standards. Alternatively communication over connection 104 may be implemented in line with other standards or proprietary communication protocols.

The battery pack 100 may be capable of carrying out a number of functions. For example the battery pack 100 may carry out measurements of the battery voltage, current drawn from the battery and/or temperature. It will be appreciated that these measurements may be carried out by suitable circuitry of the battery pack 100. The measurements may be carried with individual periodicity, for example every second, or may be in response to commands received over the bus 104.

The battery pack 100 may also check threshold levels for battery protection. This may occur during a charging cycle in order to prevent the overcharging of the battery, for example the battery pack 100 may disconnect the battery from a charger once the battery is fully charged. Alternatively or additionally this may occur during a discharging cycle in order to prevent the device drawing more current from the battery pack than the allowed limit. The battery pack 100 may also calculate characteristics such as a capacity of the battery. It will be appreciated that this is by way of example only and the battery may carry out other or additional functions.

In some embodiments, the battery pack controller 102 may receive measurements from functional circuitry of the battery pack 100 and communication over the connection 104. The controller 102 may be configured to calculate characteristics such as run time to empty and/or a remaining capacity. The battery pack controller may receive measurements from the functional circuitry of the battery pack and commands relating to management of the battery pack over the connection 104. In some embodiments the commands may relate to information required by a host controller communicating with the battery pack controller 102 and may be requests for example requests for a run time to empty or a remaining capacity of the battery. The battery pack controller 102 may be configured to calculate information regarding the battery based on the received commands and measurements and may communicate this information to the host controller.

In other embodiments a host controller may be configured to calculate information about the battery. The host controller may communicate commands to the battery pack, for example commands for measurements of the battery. The host controller may then calculate information about the battery pack, for example a run time to empty or a remaining capacity.

For example some embodiments may be implemented in single cell battery systems for example mobile phone. In these embodiments a host processor may calculate battery information for example remaining capacity. Other embodiments may be implemented in multi-cell battery systems for example notebooks. In these embodiments the battery information calculation may be carried out by a battery management controller associated with the battery pack. In systems where a host processor consumes considerable current a battery management controller such as controller 102 may be implemented in order to calculate battery information. This may allow the determination of battery information while the host processor is in standby mode.

Figure 2:
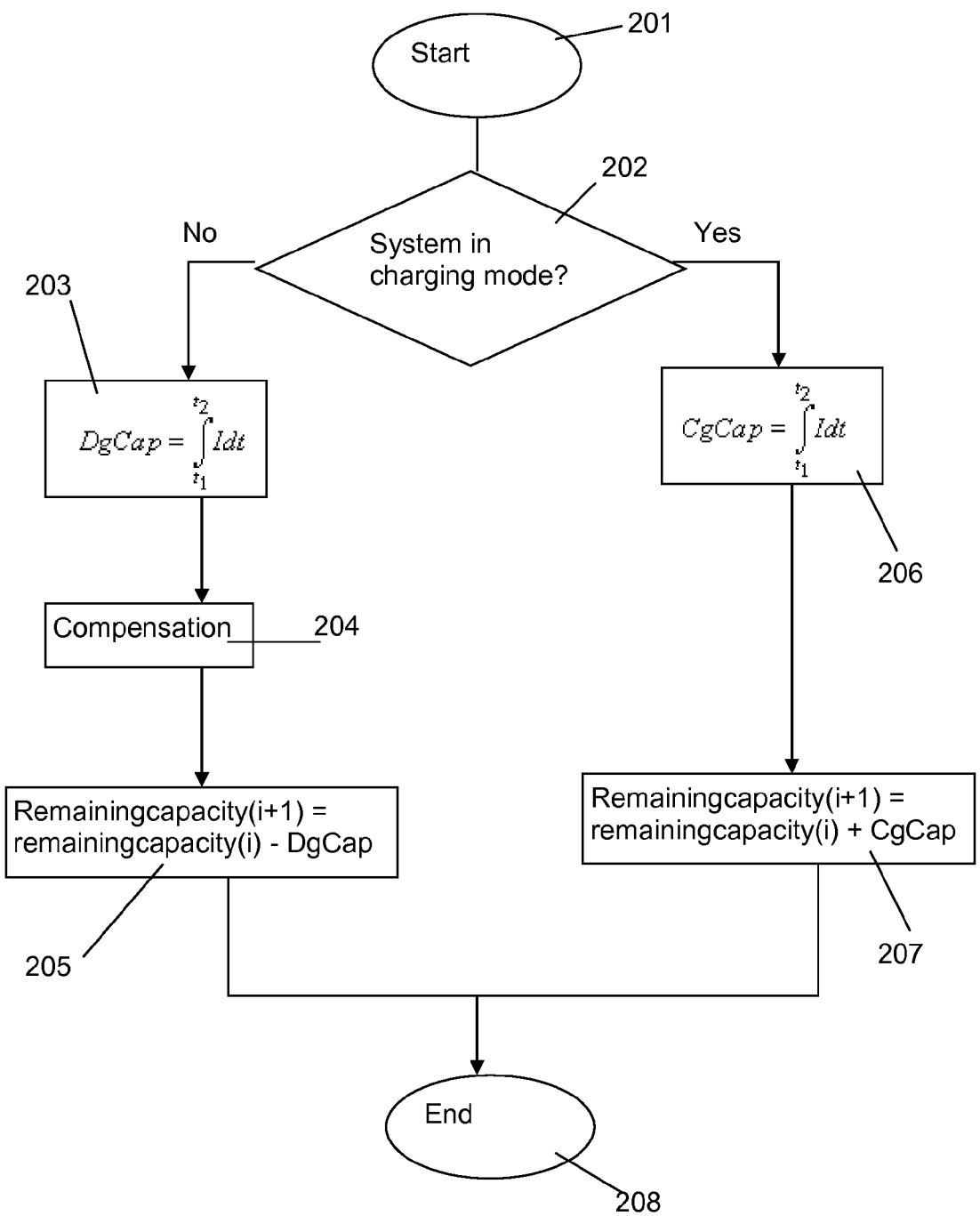
FIG. 2 shows a flow diagram of the calculation of a remaining capacity of the battery.

FIG. 2 shows an example of a method for calculating a remaining capacity of a battery. The method may be carried out by a battery pack controller 102, a host controller or a combination of the battery pack controller 102 and host controller. It will be appreciated that FIG. 2 is by way of example and other methods may be used to calculate remaining capacity.

The method starts in step 201 and then proceeds to step 202 where it is determined whether the battery is charging or discharging.

If the system is being discharged, the method progresses to step 203 where a discharged capacity is calculated.

The discharged capacity is a measure of the amount by which the battery has discharged since the most recent calculation of remaining capacity. The remaining capacity may be iteratively calculated by reducing the value of remaining capacity in accordance with the amount the battery has discharged since remaining capacity was last calculated. When a battery is fully charged, the value of remaining capacity may be set to a full charge capacity of the battery. This may be a known value provided by the battery manufacturer. Alternatively the full charge capacity may be determined by measuring the charge it takes to fully charge the battery from a fully discharged condition. In some embodiments the full charge capacity may be the charge held by the battery when the battery voltage is at a maximum and a charging current is close to 0 A.

At step 203 the discharged capacity is calculated. In some embodiments the discharged capacity is calculated as follows:

$$DgCap = \int_{t_1}^{t_2} I \, dt \quad (1)$$

where DgCap is the amount by which the battery has discharged since the last calculation of remaining capacity, t1 and t2 are the respective start and end time for the measurement of discharge and I is the current drawn from the battery.

Once the discharged capacity is calculated at step 203 the method progresses to step 204 where the discharged capacity is compensated. The amount by which a battery is discharged may be affected by factors in addition to an amount of current drawn from the battery. For example, a battery may have a self-discharge rate where the battery spontaneously discharges. In addition, the capacity of the battery may be affected by factors such as the level of the current drawn from battery as well as the temperature and/or age of the battery. The coulombic efficiency of the battery may change with time. Due to the above factors the remaining battery capacity accuracy can have an error more than 5%. The compensation at step 203 may take into account some or all of these factors and adjust the discharged amount and/or remaining capacity of the battery accordingly.

Once compensation has been carried out at step 204, the method progresses to step 205 where the remaining capacity of the battery is calculated. The remaining capacity may be calculated as follows:

$$\text{remainingcapacity}(i+1) = \text{remainingcapacity}(i) - DgCap \quad (2)$$

where remainingcapacity(i) is the previous amount of capacity remaining in the battery and remainingcapacity(i+1) is the updated remaining capacity.

The method then progresses to 208, where the method may loop back to the start 201 in order to continue the calculation of the discharge.

If it is determined at step 202 that the battery is charging, the method progresses to step 206. It will be appreciated that steps 206 and 207 of the charging mode are similar to steps 203 and 205 of the discharging mode, however the current measured is the current drawn by the battery.

At step 206 a charged capacity of the battery is calculated. The charged capacity is a measure of the increase in charge of the battery since the remaining capacity was last calculated and may be calculated as follows:

$$CgCap = \int_{t_1}^{t_2} I \, dt \quad (3)$$

where CgCap is the amount of by which the battery charge has increased over the period of time t2-t1 and I is the current drawn by the battery over that period.

The method then progresses to step 207 where CgCap is used to calculate the remaining capacity. Similarly to equation 2, the remaining capacity may be calculated as:

$$\text{remainingcapacity}(i+1) = \text{remainingcapacity}(i) + CgCap \quad (4)$$

where remainingcapacity(i) is the remaining capacity calculated in the previous iteration and remainingcapacity(i+1) is the remaining capacity calculated for this iteration taking into account the charge CgCap added since the last iteration. In some embodiments it may be determined whether a voltage of the battery has reached a maximum value and/or if the charging current is converging on 0 A. In this case, the value of remaining capacity may be considered at a full charging capacity.

The method then progresses to step 208 where it may loop back to step 201 and calculate the remaining capacity for the next measurement. It will be appreciated that the loop from step 201 to 208 may be repeated periodically. In some embodiments the remaining capacity may be calculated at a set period and t2-t1 may be equal to that set period. For example the remaining capacity may be calculated every second and the discharged capacity or charged capacity may be calculated as the integral of the current drawn from or by the battery over 1 second. It will be appreciated that other time periods may be used.

It will also be appreciated that the period for calculating remaining capacity may change according to system performance. For example where the host system is power heavy and draws a high current from the battery, the remaining capacity may be calculated more often. In a further example if the current drawn is constant, measurements may be made in larger time periods whereas if the current is dynamic, measurements may be made more often.

In some embodiments for example the controller 102 may measure the current once every second and the discharge/charge capacity calculation may be carried out every second. In other embodiments the current may be measured for example every 5 seconds. It will be appreciated that the time over which each calculation of the discharge is calculated may be selected by the controller 102. It will also be appreciated that the time period for calculating remaining capacity during a discharging mode may be different to the a time period for calculating the remaining capacity during a charging mode.

In some embodiments the value of remaining capacity may be stored in the memory 103. The remaining capacity may be provided to the processor of the device in which the battery is implemented in response a request for a remaining capacity of the device 104. For example in the smart bus management system, the remaining capacity may be retrieved from the memory 103 and sent to a host processor in response to a remainingcapacity command over bus 104. In other embodiments the value of remaining capacity may be sent to the host processor over the bus 104 whenever the value of remaining capacity is updated.

In some embodiments the remaining capacity may be given as a percentage of the full charge capacity. In some embodiments the full charge capacity of the battery may be updated as the battery ages and the remaining capacity may be given as a percentage of the updated full charge capacity. In alternative embodiments the remaining capacity may be given as a value in mAh or such similar measurements.

In some embodiments after the battery has aged, for example every 50 to 100 cycles, the full charge capacity may be compensated based on the age of the battery.

Figure 3:
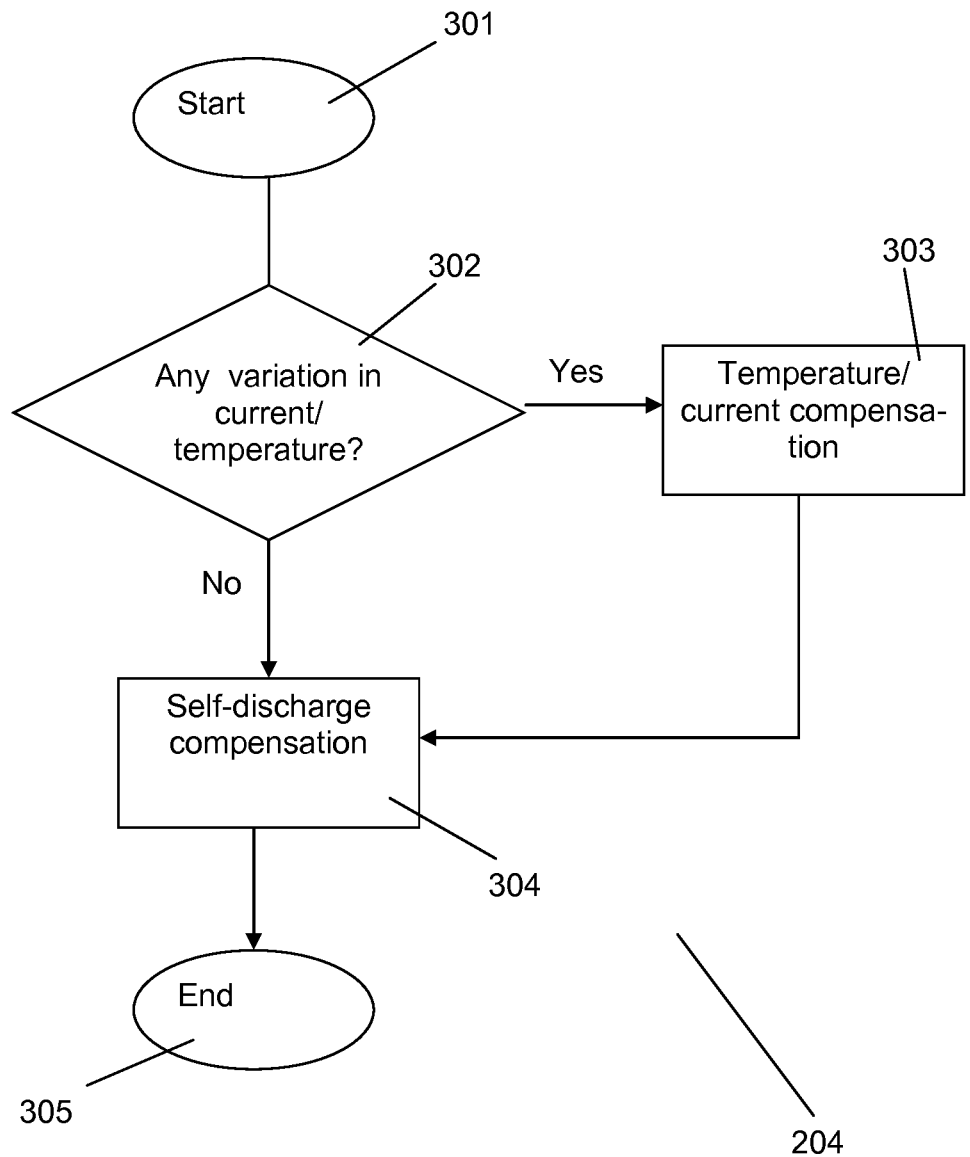
FIG. 3 shows a flow diagram of compensating a remaining capacity.

FIG. 3 illustrates a method of providing compensation in the discharging mode of a battery pack 100. It will be appreciated that the compensation may correspond to the compensation carried out at step 204 of FIG. 2.

At step 301 the method starts. The method progresses to step 302 where it is determined whether there has been a variation in temperature and/or current since the previous measurement.

In some embodiments a first measurement of temperature and/or current may be taken at a first time corresponding to a first calculation of remaining capacity and a second measurement of temperature and/or current may be taken at a second time corresponding to a subsequent calculation of remaining capacity. A change in the temperature and/or current may be determined and compared to a threshold value corresponding to an allowable threshold for variation in the temperature and/or current values.

If the variation is great, for example if the variation is higher than the threshold, the method may progress to step 303. If the variation is small, for example below the threshold then the method progresses to step 304.

Step 302 may allow a compensation due to a change in temperature and/or current to be carried out only when a change in temperature and/or current has occurred. For example if the temperature has remained constant to the previous measurement, a compensation for a change in temperature may not be required as the value of remaining capacity may have already been adjusted to take into account the temperature at this time. Similarly, if the current has remained constant, a compensation for a change in current may not be required. Where little variation is determined at step 302, the method progresses to step 304.

If there has been a change in temperature and/or current, compensation may be carried out for the battery behavior under the changed environment. A current of a battery may directly affect a discharge rate of the battery and may also affect a remaining capacity of the battery. A change in current or temperature may therefore affect the remaining capacity of the battery that is not reflected in the change in discharge. For example the capacity of the battery itself may be reduced, thus there may be different remaining capacities for a battery under different temperature conditions even if they have the same discharge capacity DgCap.

In embodiments, a discharge capacity DgCap of the battery may be compensated in order to adjust a value of remaining capacity to reflect changes in the battery environment.

The method progresses to step 303 where a compensation is carried out due to temperature and/or current conditions. In some embodiments the compensation may include compensation due to aging of the battery. For example batteries of differing ages may have different characteristics under similar current and/or temperature conditions. The age of the battery may correspond or be determined by the amount of times a battery has been charged and/or discharged.

Once compensation has been carried out for the temperature and/or current, the method progresses to step 304. At step 304 a self-discharge rate of the battery is taken into account.

A self-discharge rate of a battery may be a rate of spontaneous discharge of a battery. This may be due to the discharge of chemical reactions within the battery. The self-discharge rate is typically provided by the battery manufacturer and may be provided as a percentage of the battery capacity that is discharged per day. The uncompensated discharge capacity of the method may only take into account a discharge due to a current drawn from the battery. The self-discharge compensation of step 304 may adjust the value of discharge capacity to reflect the discharge due to the self-discharge of the battery. The self-discharge rate may be known by a battery manufacturer and may be implemented according to conditions in the battery.

At step 304, the discharged rate may be adjusted with regards to the self-discharge undergone by the battery. In some embodiments, the self discharge may be adjusted for a temperature of the battery. The battery pack may measure the temperature of the battery and base the adjustment on this.

At step 304 the discharge capacity may be adjusted to include a discharge due to the self-discharge rate for the period of time since the last calculation of remaining capacity. For example, where the discharge capacity is calculated every second, the discharge capacity may be adjusted by adding an amount of the self-discharge rate per second to that value.

It will be appreciated that the compensation due to self-discharge may be optional. In some embodiments a self-discharge may be compensated for through other means or not at all. The method may then proceed to step 305. It will be appreciated the step 305 may return to the method of FIG. 2 and progress to step 205.

If a variation of temperature and/or current is determined at step 302, the method progresses to step 303 where a compensation is carried out before the self-discharge is taken into account at step 304.

In order to provide a compensation for changes in a remaining capacity of the battery due to factors such as for example temperature, current, aging and/or other factors, the discharged capacity is compensated at step 303.

In order to provide this compensation, embodiments may make use of measurements of an operation of the battery. These measurements may be stored in the memory 103. In some embodiments measurements may be stored in a table. Table 2 shows an example of such a table.

TABLE 2

| | <(−) 20° C. | (−) 20° C. to 0° C. | 0° C. to 10° C. | 1° C. to 20° C. | 21° C. to 30° C. | 31° C. to 40° C. | 41° C. to 50° C. | >55° C. |
|---|---|---|---|---|---|---|---|---|
| 0.1 C | Time in seconds | | | | | | | |
| 0.2 C | | | | | | | | |
| 0.3 C | | | | | | | | |
| 0.4 C | | | | | | | | |
| 0.5 C | | | | | | | | |
| 0.6 C | | | | | | | | |
| 0.7 C | | | | | | | | |
| 0.8 C | | | | | | | | |
| 0.9 C | | | | | | | | |
| 1 C | | | | | | | | |
| 1.25 C | | | | | | | | |
| 1.5 C | | | | | | | | |
| 1.75 C | | | | | | | | |
| 2 C | | | | | | | | |

Table 2 has columns corresponding to a temperature range of a battery and rows corresponding to the average current of the battery. The average current may be the current measured over a period of time (for example 10 seconds). The current in the table is given as a C-rate where C is the capacity of the battery. For example a battery with a capacity C of 1000 mAh will have a C rate of 1000 mA. 0.1 C corresponds to a current of 100 mA, 0.2 C to 200 mA, etc. It will be appreciated that this is by way of example only and current may be given as a current range for the battery.

Table 2 stores an amount of time taken for the battery voltage to decrease for a given voltage step at a given average current and temperature. In some embodiments the given voltage step may be chosen as 0.2 volts. It will be appreciated that this is by way of example and the voltage step may be chosen to be other values. The voltage step may be programmable. In some embodiments, the size of the voltage step may be selected based on a trade-off between an accuracy required for the remaining capacity and memory available for the table.

While discharging, a battery voltage may decrease from a maximum voltage to a cut-off voltage. For example a battery with a maximum voltage of 4.2V, a cut-off voltage of 3V and a voltage step of 0.2V, may undergo a voltage drop from 4.2V to 4V, 4V to 3.8V, 3.8V to 3.6V, 3.6V to 3.4V, 3.4V to 3.2V and 3.2V to 3V.

Measurements may be stored for each voltage drop undergone by the battery. For example a first table like that of FIG. 2 may store measurements for the voltage drop from 4.2 to 4V, a second table like that of FIG. 2 may store measurements for the voltage drop from 4 to 3.8V, a third table like that of FIG. 2 may store measurements for the voltage drop from 3.8 to 3.6V, a fourth table like that of FIG. 2 may store measurements for the voltage drop from 3.6 to 3.4V, a fifth table like that of FIG. 2 may store measurements for the voltage drop from 3.4 to 3.2V and a sixth table like that of FIG. 2 may store measurements for the voltage drop from 3.2 to 3V.

Embodiments may therefore store measurements of a time taken for the battery voltage to undergo a voltage drop under a range of current and temperature conditions. These measurements may be stored for each voltage drop undergone by the battery from a maximum voltage to a cut-off voltage. In some embodiments measurements for one or only some of the voltage drops may be stored. For example, while the time taken for a voltage drop under a current and temperature may differ depending on the actual battery voltage, in some embodiments the time taken for drops in a certain voltage range may be similar.

Initial values of time for the table(s) may be provided by the battery manufacturer. The initial values may be based on data from a representative sample of batteries. Each table may be updated in order to take into account factors that may affect the battery over time such as for example, the age of the battery and/or the number of times the battery has been discharged. In this manner, the tables may provide an indication of the actual behavior of the battery. As the battery ages, or is affected by external or internal factors, the behavioral changes of the battery may be recorded in the table.

The tables may be used to adjust a value of the discharged capacity DgCap in order to compensate the value of remaining capacity to reflect actual battery behavior.

Each table stores, for each temperature and current pair, the amount of time taken for the battery voltage to discharge one voltage step.

A run time to empty for a battery may be calculated by summing the stored time taken for the battery to drop each remaining voltage step under the current and temperature conditions. The remaining voltage steps may be the number of voltage steps from the voltage of the battery to a cut-off voltage.

For example, if a battery voltage is 3.8V and a run time to empty command is received, the run time to empty may be calculated by adding a time measurement for a voltage drop from 3.8 to 3.6V, a time measurement for a voltage drop from 3.6 to 3.4V, a time measurement for a voltage drop from 3.4 to 3.2V and a time measurement for a voltage drop from 3.2 to 3V. Each of the time measurements may correspond to a current and temperature condition of the battery.

It will be appreciated that a current voltage of a battery will not always map cleanly on a voltage step boundary. For example a voltage of 3.8V has been exemplified however a run time to empty or remaining capacity may be determined with the battery at a current voltage of 3.7 volts which falls in the middle of a voltage step from 3.8 to 3.6V. In this case, the battery voltage may be rounded to the nearest step size. Alternatively the time associated with that step size may be scaled according to the actual battery voltage. For example the time associated with the 3.8V to 3.6V drop may be scaled by a factor of 0.5 as the battery voltage of 3.7V is halfway through the step size of 0.2V.

Run time to empty may be the amount remaining for which the battery can provide power.

Embodiments may use the run time to empty to calculate a remaining capacity of the battery under the current and temperature condition. It will be appreciated that the stored measurements may also take into account an age of the battery. The remaining capacity may be an indication of the ampere hours Ah the battery may provide. The remaining capacity of the battery under the temperature and current conditions may be calculated as follows:

$$measuredremainingcapacity=runtimetoempty*averagecurrent \quad (5)$$

where measured remaining capacity is the remaining capacity according to the stored time measurements for the current and temperature of the battery and average current is the average value of the current being drawn from the battery. For example the average current being drawn in the last 10 measurements. In some embodiments runtimetoempty is calculated in response to a runtimetoempty command or request from a host system. It will be appreciated that the runtimetoempty in equation 5 may be replaced by the sum of the measured times for the remaining voltage steps.

The measured remaining capacity may be used to adjust the discharge capacity DgCap such that the calculated remaining capacity remaining capcity(i+1) is compensated. This compensation may be to adjust the value of remainingcapacity(i+1) to reflect the capacity of the battery remaining as measured. The remainingcapacity (i+1) may be adjusted to take into account factors affecting remaining battery capacity in addition to the measurement of DgCap. For example the discharge capacity may be adjusted as follows:

$$DgCap(adjusted)=(remainingcapacity(i)-measuredremainingcapacity)+DgCap \quad (6)$$

where measuredremainingcapacity is calculated as in equation (5). DgCap(adjusted) may be the amount by which the current value of remaining capacity remaingingcapacity(i) must be adjusted to bring it in line with the remaining capacity according to the Table 2. DgCap(adjusted) may be returned to step 205 in FIG. 2 where remainingcapacity(i+1) is calculated.

It will be appreciated that the above equations are by way of example only and other means may be used to calculate a discharged capacity DgCap compensation needed.

Each relevant table may be updated for every voltage step corresponding to that table. In some embodiments a table may not be updated if a current or temperature has varied greatly during the time taken drop the voltage step. In this case a time measurement may not be indicative of the time taken at a specific current and temperature.

Figure 4:
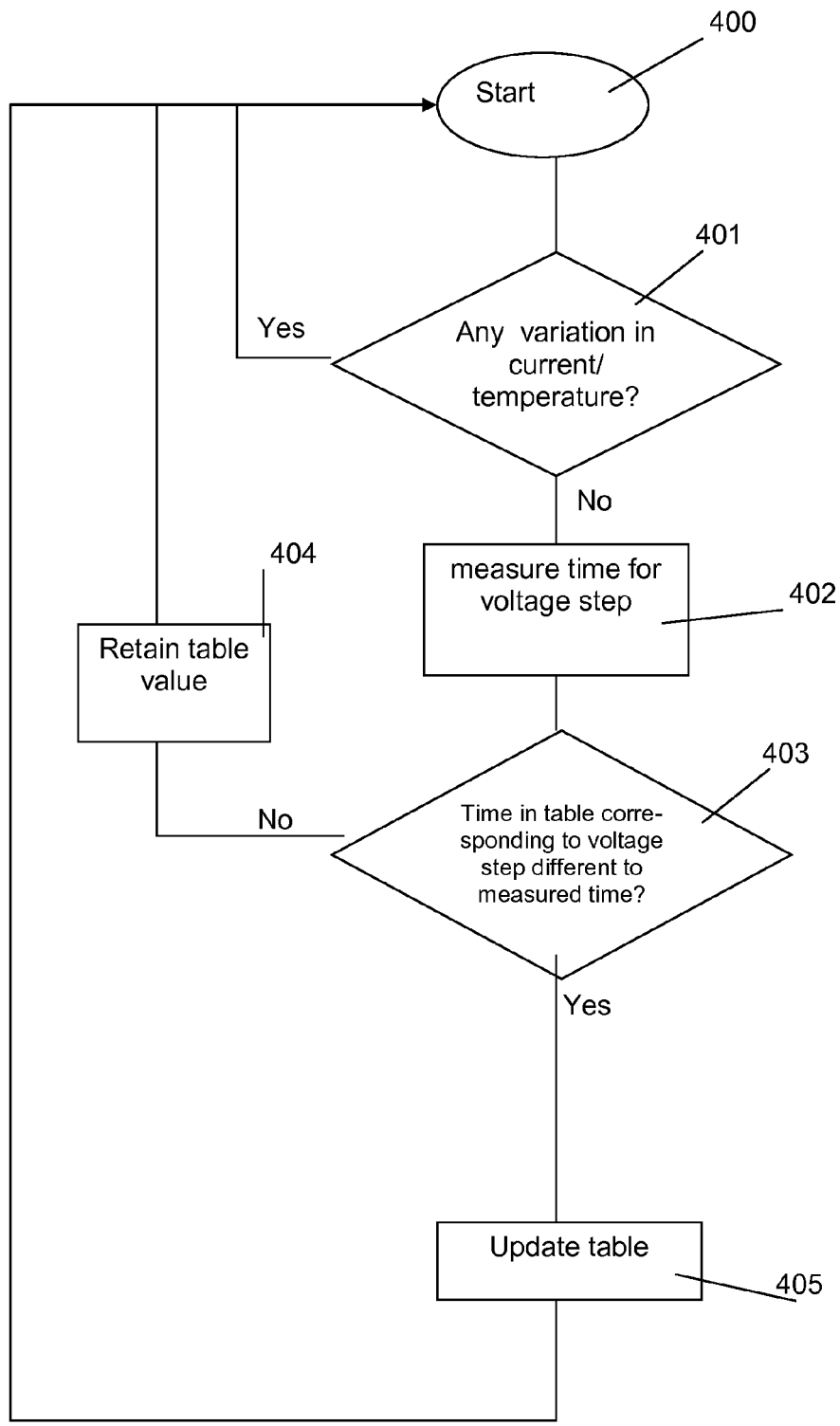
FIG. 4 shows a flow diagram of a method used to update a table.

FIG. 4 provides a method for maintaining and updating the tables storing the time measurements. In some embodiments the method of FIG. 2 is repeated for each drop in the battery voltage corresponding to the voltage step size. In some embodiments a battery pack controller may have a timer. A first value of the time may be taken at the start of a voltage drop and a second value may be taken at the end of the voltage drop. The controller may calculate a time taken for a voltage drop from these values. Alternatively, the timer may be reset at the start of each voltage drop. In some embodiments the voltage may be monitored by functional circuitry of the battery pack.

At step 400 the method starts. In some embodiments a determination may be made whether a host processor is in a low power mode. If the host processor is in the low power mode, the method may not start. A host processor of a device powered by the battery pack 100 may go into a low power mode, for example a sleep mode, when the device is not drawing much current. In some embodiments the tables are not updated in the low power mode. This may be because a low power mode may not be indicative of a typical power use of the host device.

The method progresses to step 401 where it is determined whether there has been a variation in a current or temperature of the battery during a voltage drop. A large variation may indicate that the measured time is not indicative of behavior at a specific current or temperature but rather of transient current and/or temperature. The variation may be measured for example by comparing a change in the temperature and/or current to a threshold. It will be appreciated that the threshold may be set corresponding to the implementation of the battery and accuracy requirements for the battery measurements.

If it is determined that there has not been a substantial variation the method progresses to step 402. At step 402 a time period for the battery voltage to undergo a voltage drop corresponding to a voltage step is measured. In some embodiments this may be done by using a timer of the controller 102 in conjunction with a battery voltage measurement. In one example the timer may be started at a first voltage and stopped when the first voltage has decreased by the voltage step. It will be appreciated that the timer may run continuously and a start and stop time monitored for each voltage step.

Once a time taken to drop a voltage step is measured, the method progresses to step 403.

At step 403 a time stored in the table corresponding to the voltage drop is retrieved. The time may correspond to the temperature and current of the battery. The retrieved time is compared to the time measured at step 402. If the retrieved time and measured time are substantially similar, the method returns to step 400 and repeats for the next voltage drop. In this case the retrieved time is retained at the table value an in block 404.

If the retrieved time and the measured time are different, the method progresses to step 405.

It will be appreciated that in some embodiments, a difference between the retrieved time and the measured time may be compared to a threshold to determine whether the times are different or substantially similar. It will be appreciated that the threshold may be set according to system requirements. For example the required accuracy of the values such as remaining capacity and a run time to empty may be considered in light of the processing resources.

At step 405 time measured at step 402 is stored in the table.

In some embodiments a difference between the measured time and retrieved time ΔT may also be calculated.

The stored times may also be used to calculate responses to other commands. For example in addition to calculating a run time to empty for the battery in order to calculate the measuredremainingcapacity, a run time to empty may be calculated in response to a runtimetoempty command. For example, using the smart battery system standard, a runtimetoempty command may be received from a host processor and the runtime to empty may be calculated. In some embodiments the runtime to empty may be calculated by adding all table values of different voltage steps for the same current and temperature before the cut-off voltage is reached by the time value in the table.

In some embodiments, a runtimetoempty command may be received before the table is updated. In this case ΔT may be used to calculate runtimetoempty of the battery.

In some embodiments the time taken to drop a voltage step may be calculated by using a timing peripheral in the controller.

In embodiments the table may be stored in the storage unit of the controller. The controller may then calculate values such as a remaining time to empty where a remaining capacity using the values stored in the table. The controller may also monitor the voltage across the battery pack as per FIG. 4 in order to update the table periodically.

It will be appreciated that a battery pack controller may comprise a processor for carrying out embodiments. The processor may execute a computer program for determining battery information.

It will be appreciated that embodiments relate to compensating a discharge amount of a battery to take into factors that may affect the discharge rate or remaining capacity. Although a method of calculating a discharge has been given as the integral of current over time, it will be appreciated that other methods may be used to calculate an initial discharge.

What is claimed is:

1. A method, comprising:
   measuring a voltage of a battery using measurement circuitry associated with the battery in real time while the battery is discharging;
   determining in real time while the battery is discharging and while the voltage of the battery is being measured, and using a processor coupled to the measurement circuitry, a plurality of time periods, each time period being determined as a function of the measured voltage of the battery that was measured in real time while the battery is discharging and each time period corresponding to an elapsed time for the measured voltage of the battery to change in a voltage step from an initial voltage for that time period to a final voltage for that time period, and each time period being associated with a first condition of the battery;
   calculating in real time while the battery is discharging and while the voltage of the battery is being measured, using the processor, a run time to empty of the battery based on a given one of the determined plurality of time periods that was determined as a function of the measured voltage of the battery that was measured in real time while the battery is discharging;
   compensating in real time while the battery is discharging and while the voltage of the battery is being measured, using the processor, a remaining capacity of the battery based on the calculated run time to empty of the battery, the compensating being performed due to self discharge of the battery, based upon lack of variation of the first condition associated with the given one of the determined plurality of time periods used in calculating the run time to empty of the battery, the given one of the determined plurality of time periods having been determined as a function of the measured voltage of the battery that was measured in real time while the battery is discharging;
   compensating in real time while the battery is discharging and while the voltage of the battery is being measured, using the processor, the remaining capacity of the battery based on the calculated run time to empty of the battery, the compensating being performed due to the first condition of the battery, associated with the given one of the determined plurality of time periods used in calculating the run time to empty, based upon variation of the first condition, wherein the self discharge of the battery is a second condition of the battery, the given one of the determined plurality of time periods having been determined as a function of the measured voltage of the battery that was measured in real time while the battery is discharging.

2. The method of claim 1, wherein the first condition is at least one of battery temperature and battery current.

3. The method of claim 1, wherein the voltage of the battery comprises a plurality of voltage steps from a maximum voltage to a cut-off voltage.

4. The method of claim 3, wherein determining the run time to empty of the battery comprises summing each time period.

5. The method of claim 1, wherein determining the plurality of time periods comprises retrieving at least one of a plurality of times from a memory.

6. The method of claim 1, wherein determining the plurality of time periods comprises:
   measuring a period of time associated with the first condition and a change of voltage of the battery in a first voltage step;
   retrieving a stored period of time associated with the first condition and the first voltage step;
   comparing the stored period of time and the measured period of time; and
   replacing the stored period of time with the measured period of time based upon a difference therebetween.

7. The method of claim 6, wherein measuring the period of time comprises receiving a timer value.

8. The method of claim 1, further comprising storing each of the plurality of time periods in a table.

9. The method of claim 1, wherein the step of compensating comprises:
   adjusting an amount by which the battery has discharged since a previous calculation of remaining capacity;
   calculating the remaining capacity based on the adjusted amount.

10. The method of claim 9, wherein the amount by which the battery has discharged is calculated as an amount of current drawn by the battery over a time period used in calculating the run time to empty.

11. The method of claim 10, wherein the time period used in calculating the run time to empty is one second.

12. The method of claim 9, further comprising:
   determining a variation of the first condition of the battery since the previous calculation of remaining capacity; and
   compensating the amount by which the battery has discharged in response to the variation.

13. An apparatus, comprising:
   measurement circuitry configured to measure a voltage of a battery in real time while the battery is discharging;
   a processor coupled to the measurement circuitry and configured to
      determine in real time, while the battery is discharging and while the voltage of the battery is being measured, whether a first condition of the battery has changed over a time period corresponding to an elapsed time for the measured voltage of the battery to change in a voltage step from an initial voltage for that time period to a final voltage for that time period,
      measure the time period in response to the first condition of the battery changing, and calculate, in real time while the battery is discharging and while the voltage of the battery is being measured, a run time to empty of the battery based on the measured time period, compensate, in real time while the battery is discharging and while the voltage of the battery is being measured, a remaining capacity of the battery based on the calculated run time to empty of the battery, the compensating being performed due to self discharge of the battery and based upon lack of variation of the first condition during the time period, and compensate, in real time while the battery is discharging, the remaining capacity of the battery based on the calculated run time to empty of the battery for the first condition of the battery, wherein the self discharge of the battery is a second condition of the battery different than the first condition of the battery.

14. The apparatus of claim 13, wherein the first condition of the battery is at least one of battery temperature and battery current.

15. The apparatus of claim 13, wherein each time period is further associated with a voltage step of the battery.

16. The apparatus of claim 15, wherein the voltage of the battery comprises a plurality of voltage steps from a maximum voltage to a cut-off voltage.

17. The apparatus of claim 16, wherein the change in voltage corresponds to a step size of the voltage step.

18. The apparatus of claim 17, wherein the time period is one second.

19. The apparatus of claim 16, wherein the processor is further configured to determine the run time to empty of the battery by summing the time periods associated with each of the plurality of voltage steps from a battery voltage to the cut-off voltage.

20. The apparatus of claim 16, wherein an amount by which the battery has discharged is calculated as an amount of current drawn by the battery during a time period.

21. The apparatus of claim 16, wherein the processor is further configured to determine a variation of the first condition of the battery since a previous calculation of remaining capacity; and if there is a variation then compensate an amount by which the battery has discharged.

22. The apparatus of claim 15, wherein the processor is configured to determine the time periods by measuring a time associated with the first condition of the battery and a first voltage step; retrieve a stored time associated with the first condition of the battery and the first voltage step; compare the stored time and the measured time; and if the times are different replace the stored time with the measured time.

23. The apparatus claim 22, wherein the processor is further configured to:
   determine if the first condition of the battery has been constant during the first voltage step; and
   if the first condition of the battery has been constant then measure the time.

24. The apparatus of claim 22, wherein the processor is further configured to receive a timer value and measure the time based on the received timer value.

25. The apparatus of claim 24, further comprising a timer configured to measure an amount of time taken for the change in voltage of the battery.

26. The apparatus of claim 15, wherein the processor is configured to compensate the remaining capacity of the battery by adjusting an amount by which the battery has discharged since a previous calculation of remaining capacity and calculate the remaining capacity based on the adjusted amount.

27. The apparatus of claim 13, wherein the processor is configured to determine the time periods by measuring a time taken for the change in voltage.

28. The apparatus of claim 13, wherein the processor is further configured to determine the time periods by retrieving at least one of a plurality of times from a memory.

29. The apparatus of claim 13, further configured to store each of the time periods in a table.

30. The apparatus of claim 13, further comprising a memory configured to store at least one of the time periods.

* * * * *